United States Patent [19]
Murai

[11] Patent Number: 5,359,217
[45] Date of Patent: Oct. 25, 1994

[54] MOS SEMICONDUCTOR MEMORY DEVICE HAVING STACK CAPACITOR WITH METAL PLUG

[75] Inventor: Ichiro Murai, Sagamihara, Japan

[73] Assignee: Nippon Steel Corporation, Tokyo, Japan

[21] Appl. No.: 103,706

[22] Filed: Aug. 10, 1993

[30] Foreign Application Priority Data

Aug. 11, 1992 [JP] Japan .................. 4-235325

[51] Int. Cl.⁵ .......................................... H01L 27/10
[52] U.S. Cl. ................... 257/306; 257/383; 257/752; 257/297
[58] Field of Search ............... 257/306, 383, 752

[56] References Cited

U.S. PATENT DOCUMENTS 4,970,564 11/1990 Kimura et al. ............... 257/306
4,994,893 2/1991 Ozaki et al. ................. 257/306
5,143,861 9/1992 Turner ............................ 437/52

FOREIGN PATENT DOCUMENTS 1-119054 5/1989 Japan .
2-151060 6/1990 Japan .................. 257/206

*Primary Examiner*—Robert Limanek
*Attorney, Agent, or Firm*—Pollock, Vande Sande & Priddy

[57] ABSTRACT

A semiconductor memory device comprising a semiconductor substrate, a MOS transistor formed on the semiconductor substrate and having source and drain diffused layers and a gate, an interlayer insulating film covering the MOS transistor, a contact hole formed in the interlayer insulating film so as to reach one of the source and the drain diffused layers, a metallic layer filling up the contact hole and a capacitor formed on the interlayer insulating film and connected electrically to the one diffused layer through the metallic layer.

7 Claims, 5 Drawing Sheets

FIG. IE
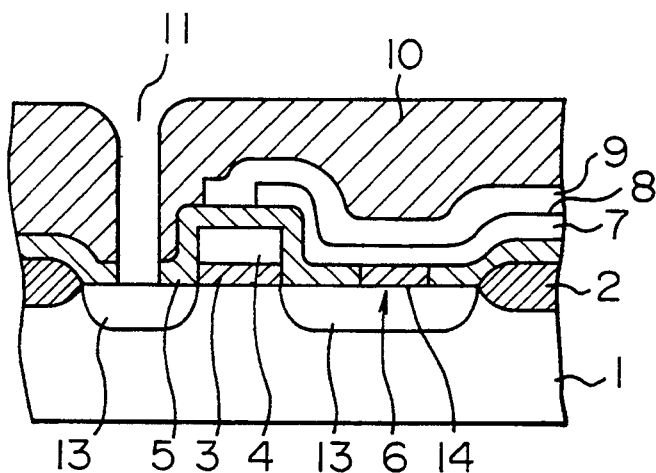
FIG. IF
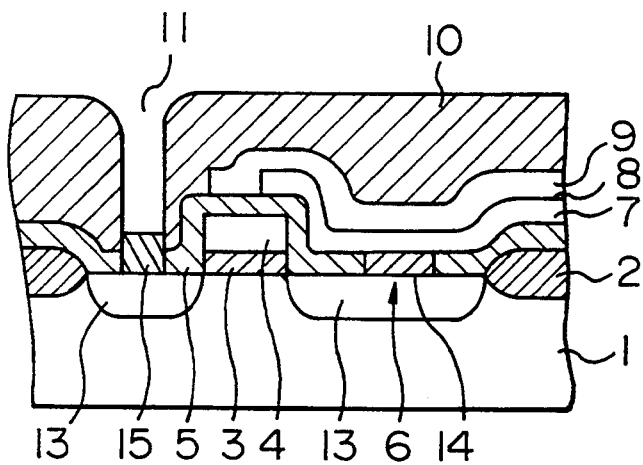
FIG. IG
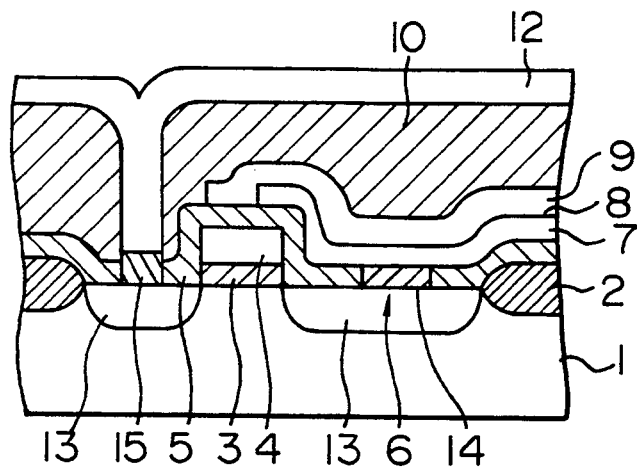

5,359,217

MOS SEMICONDUCTOR MEMORY DEVICE HAVING STACK CAPACITOR WITH METAL PLUG

FIELD OF THE INVENTION

The present invention relates to a semiconductor memory device and more particularly to a MOS semiconductor memory device such as a DRAM having a stack capacitor and a method of manufacturing the same.

BACKGROUND OF THE INVENTION

As to a structure of a DRAM having a stack capacitor, it is disclosed for example, in JP-A-1-119054. The method of manufacturing the known DRAM will be described with reference to FIGS. 4A–4D.

After an element isolation film 102 and a gate electrode 104 are formed on a surface of a silicon semiconductor substrate 101, source/drain diffused layers 113 are formed selectively (FIG. 4A). Next, an interlayer insulating film 105 is formed on the whole surface of the silicon semiconductor substrate so as to cover the gate electrode 104, the diffused layers 113 and the isolation film 102, and a contact hole 106 reaching one of source and drain diffused layers is formed through the interlayer insulating film 105 ( FIG. 4B ). Then, a lower electrode 107, a dielectric film 108 and an upper electrode 109 of a capacitor for storing electric charges are formed successively at an area over the contact hole 106 (FIG. 4C), and then an interlayer insulating film 110 is formed to cover them.

Lastly, a contact hole 111 is formed through the interlayer insulating film 110 and the interlayer insulating film 105 to reach the other of the source and drain diffused layers 113, and a metallic interconnection 112 is formed to extend into the contact hole 111 (FIG. 4D).

One memory cell having one transistor and one capacitor in a DRAM is formed by the process described above. A write word line and a read bit line are provided by the electrode 104 and the metallic interconnection 112, respectively.

In a semiconductor memory device manufactured by a conventional method as described above, a lower electrode (storage node) constituting a capacitor in a DRAM is formed of a thin polysilicon film containing impurities. Therefore, when α-rays are incident to a Si substrate from cosmic rays in the space or radioactive substances such as Uranium contained in a small quantity in a package, electron-hole pairs are generated by ionization along an incident path of α-rays in a depletion layer at a depth of the Si substrate. These electron-hole pairs are accelerated by an electric field as applied to the depletion layer, amplified by an avalanche phenomenon and trapped by the lower electrode of the capacitor, thereby to change the capacitance of the capacitor. This invites a problem of a so-called soft error, resulting in less reliability.

SUMMARY OF THE INVENTION

It is an object of the present invention to provide a semiconductor memory device having a stack capacitor of high reliability and capable of preventing a soft error due to α-rays and a method of manufacturing the same.

A method of manufacturing a semiconductor memory device according to the present invention comprises the steps of: forming a MOS transistor having source and drain diffused layers and a gate on a semiconductor substrate; forming an interlayer insulating film covering the MOS transistor; forming a contact hole in the interlayer insulating film to reach one of the source and drain diffused layers; depositing a metallic layer so as to fill up the contact hole; and forming a capacitor, which is connected to the one of the source and drain diffused layers through the metallic layer, on the interlayer insulating film.

A semiconductor memory device according to the present invention comprises: a semiconductor substrate; a MOS transistor formed on the semiconductor substrate and having source and drain diffused layers and a gate; an interlayer insulating film covering the MOS transistor; a contact hole formed in the interlayer insulating film to reach one of the source and drain diffused layers; a metallic layer deposited to fill up the contact hole; and a capacitor formed on the interlayer insulating film and connected electrically to the one of the source and drain diffused layers through the metallic layer.

According to the present invention, since the contact hole formed in the interlayer insulating film is filled up with a metallic layer, this prevents impurities being diffused into the silicon substrate from a polysilicon film constituting the lower electrode of the capacitor through the source or drain diffused layer by incidence of α-rays, thus preventing occurrence of a soft error caused by α-rays.

BRIEF DESCRIPTION OF THE DRAWINGS

FIGS. 1E–1G are sectional views showing modification of the first embodiment.

DESCRIPTION OF THE PREFERRED EMBODIMENTS

A first embodiment of the present invention will be described with reference to FIGS. 1A–1D.

Figure 1A:
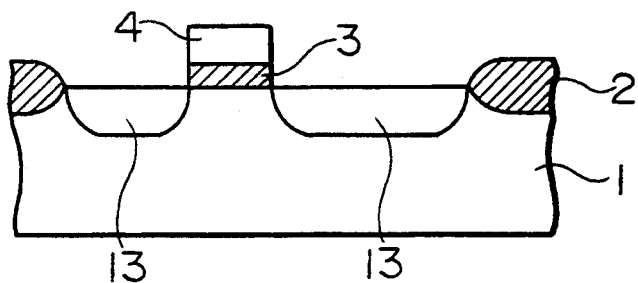
FIGS. 1A–1D are sectional views for explaining the steps a method of manufacturing a semiconductor memory device according to a first embodiment of the present invention.

In FIG. 1A, a field oxide film 2 having a specific resistance of 2 to 15 Ω-cm is formed with a film thickness of 300 to 1,000 nm into a predetermined pattern on a P-type silicon semiconductor substrate 1 using a LOCOS method. Subsequently, after a gate oxide film 3 is formed with a film thickness of 10 to 50 nm by a thermal oxidation method, a thin polysilicon film having a film thickness of 150 to 500 nm is formed on the whole surface of the substrate by a CVD method. Then, impurities such as phosphorus (P) are diffused into the polysilicon film at a concentration of approximately $1 - 8 \times 10^2$ atoms/cm$^3$ by a thermal oxidation method so as to lower the resistance thereof. Thereafter, a gate electrode 4 is formed by patterning the polysilicon film by a micro-lithography method. Phosphorus, arsenic (As) or the like which is an N-type impurity is diffused into the substrate by a selective ion implantation method using the gate electrode 4 and the field oxide film 2 as a mask so as to form source and drain diffused layers 13 at a surface concentration of $1 \times 10^{19} - 10^{20}$ atoms/cm$^3$ and to a depth of approximately 0.1 to 0.5 μm, thus forming a MOS field effect transistor isolated by means of the field oxide film.

Figure 1B:
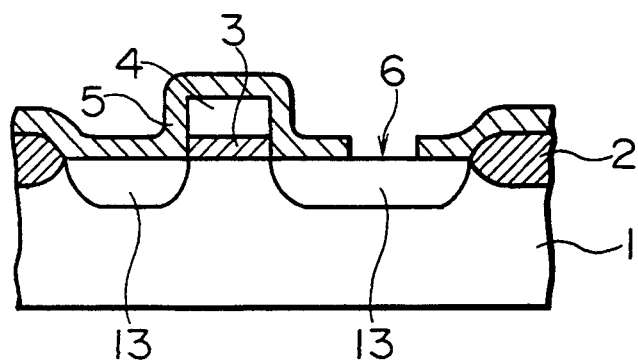

Next, as shown in FIG. 1B, a silicon dioxide (SiO$_2$) film is formed with a thickness of approximately 50 to 300 nm over the MOS field effect transistor by a CVD method, thus forming an interlayer insulating film 5. Thereafter, a contact hole 6 reaching one of the source and drain 13 of the MOS field effect transistor is formed at a portion of the interlayer insulating film 5 disposed on one of the source and drain regions 13 by a microlithography method.

Figure 1C:
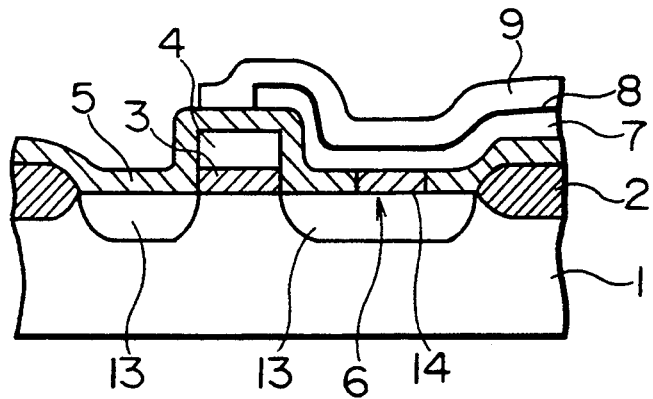

Then, as shown in FIG. 1C, a tungsten (W) is deposited only on the silicon substrate surface by reduction of a gas of tungsten hexafluoride (WF$_6$) or the like through a CVD method utilizing a difference between a deposition rate on the interlayer insulating film 5 and that on the substrate, thereby to form a tungsten layer, that is, a tungsten plug 14 (a metallic layer). A lower electrode 7 ( storage node ) and an upper electrode 9 ( cell plate), which constitute a capacitor together with a capacitor dielectric film 8 interposed therebetween, are each formed by forming a thin polysilicon film with a thickness of approximately 50 to 300 nm using a CVD method diffusing therein impurities of phosphorus or arsenic at a concentration of approximately $1-8 \times 10^{20}$ atoms/cm$^3$ by a thermal diffusion method or an ion implantation method, and patterning it by a microlithography method. Further, the capacitor dielectric film 8 is formed of an ONO film (a three-layer film of a natural oxide film - a CVD silicon nitride (SIN) film - a thermal oxide film), having a thickness capable of providing the same electric capacity as that of the SiO$_2$ film having a film thickness of 5 to 10 nm. It is possible to apply patterning to the upper electrode 9 and the dielectric film 8 successively using the same mask.

Figure 1D:
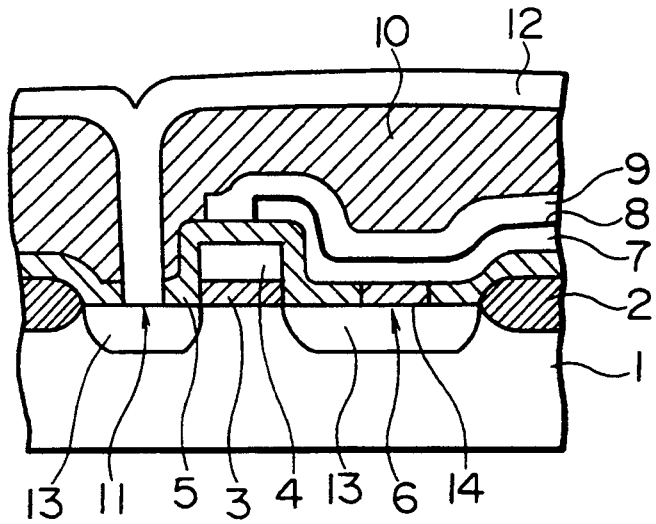

Next, as shown in FIG. 1D, an interlayer insulating film 10, a contact hole 11 and a metallic interconnection 12 are formed successively thereby to complete a device structure.

The steps as shown in FIGS. 1A to D may be replaced by the following steps. After a semi-product as shown in FIG. 1C has been made, an interlayer insulating film 10 is formed on the whole surface of the semi-product and a contact hole 11 is formed through the insulating films 10 and 25 to reach the source of drain region 13 as shown in FIG. 1E'. Then, a tungsten layer 15 is formed at the bottom of the contact hole by selective growth of a tungsten as shown in FIG. 1E. Finally, a wiring layer or interconnection layer 12 of a metallic material such as aluminum is formed on the insulating film 10 to fill the contact hole 11 as shown in FIG. 1G.

Figure 2A:
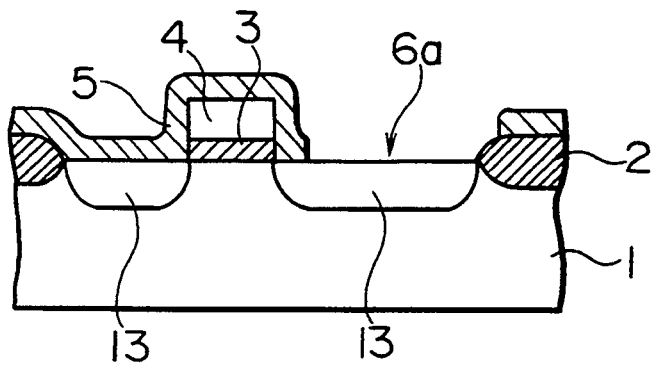
FIGS. 2A–2C are sectional views for explaining the steps of a method of manufacturing a semiconductor memory device according to a second embodiment of the present invention.

Next, a second embodiment of the present invention will be described with reference to FIGS. 2A-2C. The second embodiment is a modification of the first embodiment, and is the same as the first embodiment until the field oxide film 2 and the MOS transistor are formed ( FIG. 1A ). Then, in the second embodiment, after forming a silicon dioxide (SiO$_2$) film in a thickness of approximately 50 to 300 μm by a CVD method thereby to form an interlayer insulating film 5, a contact hole 6a is formed in a part of the interlayer insulating film 5 above one of the source and drain diffused layers 13. The contact hole 6a is larger than the contact hole 6 in the first embodiment so as to cover almost entirely the one of the source/drain diffused layers. A part of the field oxide film 2 is exposed at one edge of the contact hole 6a, while the other edge thereof is separated by a distance not less than the thickness of the interlayer insulating film 5 from the gate electrode 4 and the gate insulating film 3 so that a tungsten plug formed in a later process does not come into contact with the gate electrode 4 (FIG. 2A).

Figure 2B:
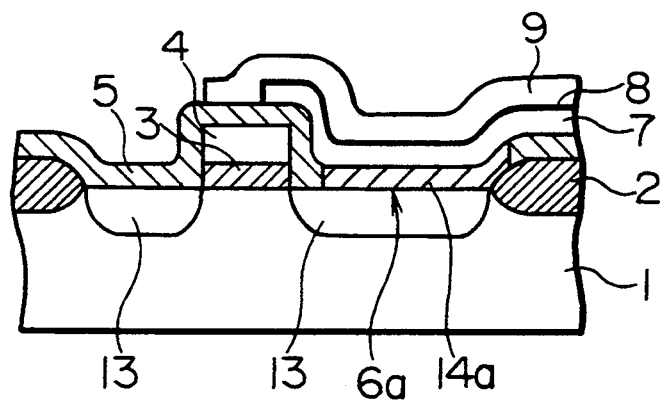
Figure 2C:
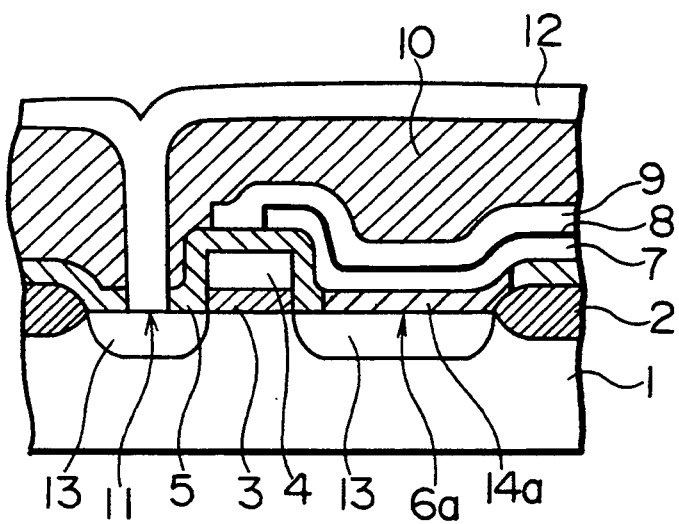

Next, as shown in FIG. 2B, a tungsten plug 14a is deposited so as to fill up the contact hole 6a by a CVD method using the interlayer insulating film 5 as a mask in a similar process as the first embodiment, and then, a lower electrode 7, a dielectric film 8 and an upper electrode 9 of a capacitor are formed (FIG. 2B). Then, as shown in FIG. 2C, an interlayer insulating film 10, a contact hole 11 and a metallic interconnection 12 are formed successively, thus completing a cell structure of a semiconductor memory device.

Next, a third embodiment of the present invention will be described with reference to FIGS. 3A to 3D. The third embodiment differs from the first embodiment in that a tungsten plug is also deposited in a contact hole for the bit line 12.

Figure 3A:
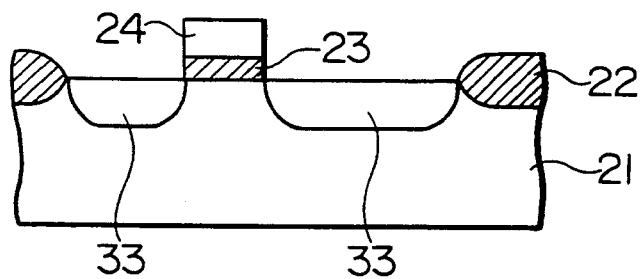
FIGS. 3A–3D are sectional views for explaining the steps of a method of manufacturing a semiconductor memory device according to a third embodiment of the present invention.
Figure 3B:
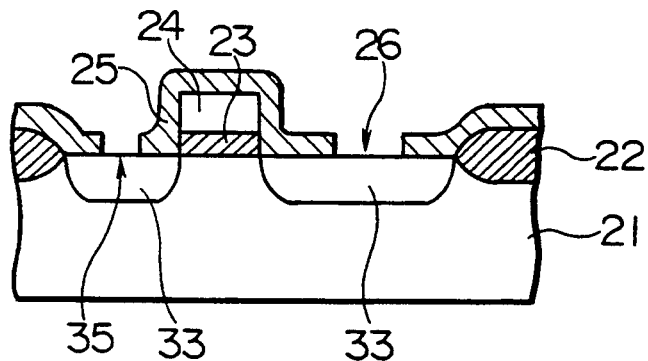
Figure 3C:
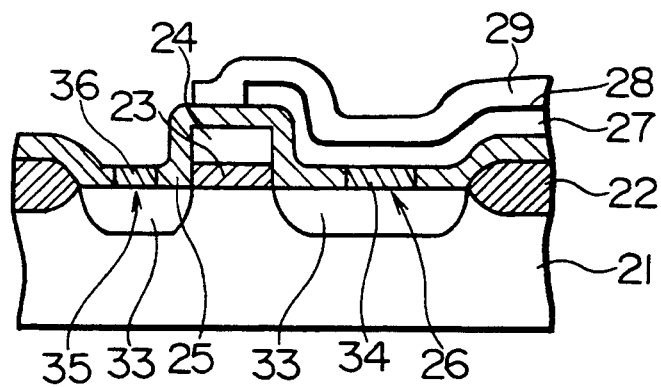
Figure 3D:
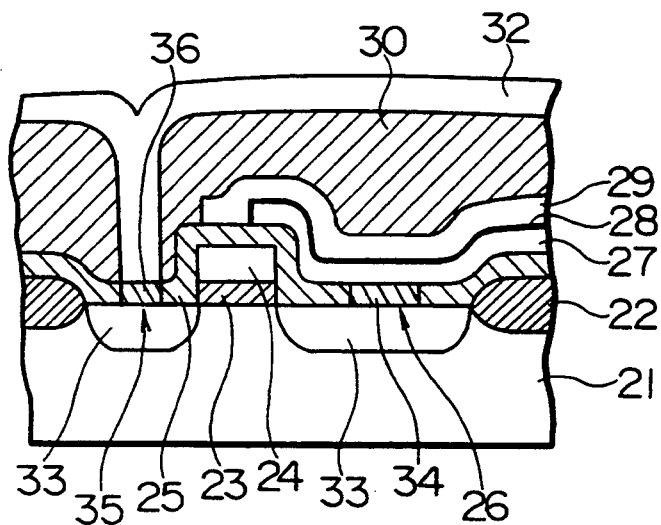
Figure 4A:
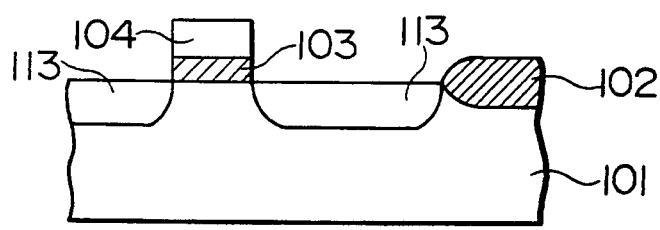
FIGS. 4A–4D are sectional views for explaining the steps of a conventional method of manufacturing a semiconductor memory device.
Figure 4B:
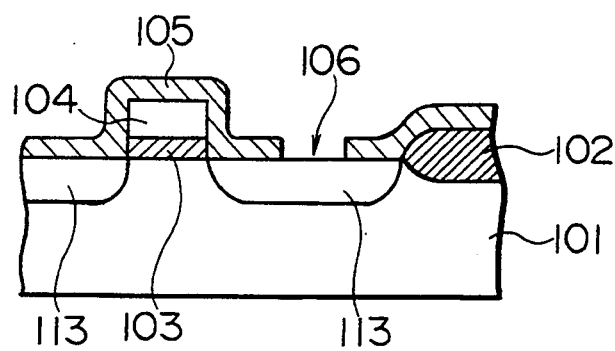
Figure 4C:
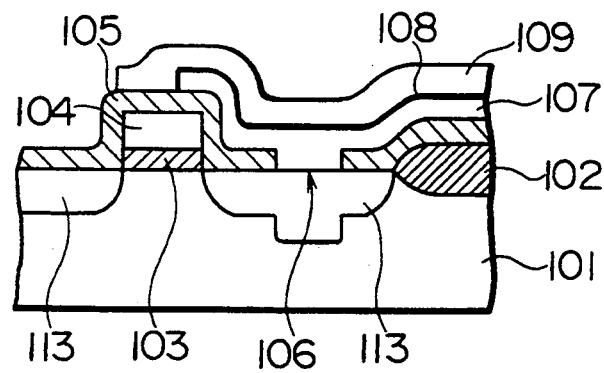
Figure 4D:
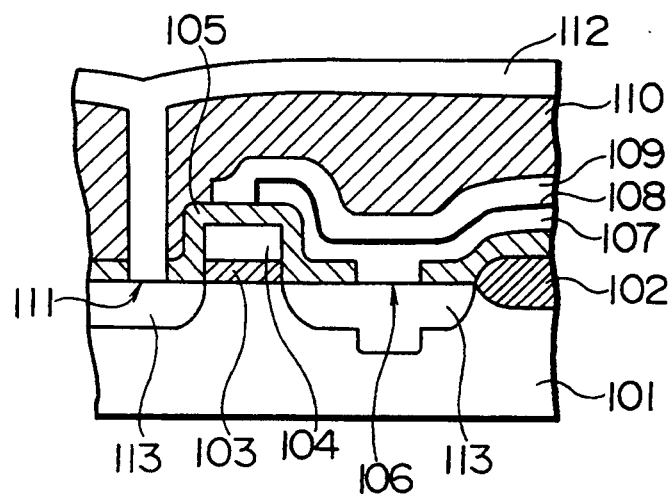

A field oxide film 22, a gate insulating film 23 and a gate electrode 24 are formed in a similar manner as in the first embodiment (FIG. 3A). Next, after forming an interlayer insulating film 25 (FIG. 2B), a contact hole 26 for connection between the lower electrode 27 and one of the source and drain diffused regions 33 and a contact hole 35 for connection between the bit line 32 and the other of the source and drain diffused regions 33 are formed at the same time using a micro-lithography method, and a tungsten plug 34 and a tungsten plug 36 are formed by filling up the contact hole 26 and the contact hole 35 by a similar method as in the first embodiment as shown in FIG. 3C. Thereafter, a capacitor is structured by forming a lower electrode 27 and an upper electrode 29 with a capacitor dielectric film 28 interposed therebetween above the tungsten plug 34 and a part of the interlayer insulating film 25 adjacent thereto. Next, an interlayer insulating film 30 is formed, as shown in FIG. 3D, and then a contact hole is formed in the insulating film 30 to reach the tungsten plug 36. A bit line 32 is thereafter formed of a conductive material such as a metallic material, polysilicon containing impurities or a composite thereof so as to fill up the contact hole and also cover the interlayer insulating film 30.

According to the present invention, it is possible to prevent effectively generation of a soft error caused by α-rays, and to manufacture a semiconductor memory device of high reliability.

I claim:

1. A semiconductor memory device comprising:
   a semiconductor substrate;
   a MOS transistor formed on said semiconductor substrate and having source and drain diffused layers and a gate;
   an interlayer insulating film covering said MOS transistor;
   a contact hole formed in said interlayer insulating film and reaching one of said source and drain diffused layers;
   a metallic layer filling up said contact hole; and
   a capacitor formed on said interlayer insulating film and including a first polysilicon layer containing impurities and formed on said metallic layer, a dielectric film formed on said first polysilicon layer and a second polysilicon layer containing impurities and formed on said dielectric film, said first polysilicon layer being connected electrically to said one of said source and drain diffused layers through said metallic layer.

2. A semiconductor memory device according to claim 1, wherein said metallic layer is formed of a material containing tungsten.

3. A semiconductor memory device according to claim 1, wherein said contact hole is formed so that a part of said one of said source and drain diffused layers is exposed.

4. A semiconductor memory device according to claim 1, further comprising:
   a second contact hole formed in said interlayer insulating film and reaching the other of said source and drain diffused layers;
   a second metallic layer filling up said second contact hole;
   a second interlayer insulating film covering said capacitor and said first-mentioned interlayer insulating film;
   a third contact hole formed in said second interlayer insulating film and communicating with said second contact hole; and
   a layer of a conductive material formed on said second interlayer insulating film and extending into said third contact hole so as to be connected electrically to said other diffused layer through said second metallic layer.

5. A semiconductor memory device according to claim 1, further comprising:
   a second interlayer insulating film covering said capacitor and said first-mentioned interlayer insulating film;
   a second contact hole formed through said first and second interlayer insulating films to reach the other of said source and drain diffused layers;
   a second metallic layer formed at a bottom of said second contact hole; and
   a layer of conductive material formed on said second interlayer insulating film and extending into said second contact hole, said layer being electrically connected to the other of source and drain diffused layers through said second metallic layer.

6. A semiconductor memory device comprising:
   a semiconductor substrate;
   a field oxide film;
   a MOS transistor having source and drain diffused layers and a gate formed on an area of a surface of said semiconductor substrate and isolated from other area of the surface of said semiconductor substrate by said field oxide film, wherein each of said source and drain diffused layers is located between said gate and said field oxide film:
   an interlayer insulating film covering said MOS transistor;
   a contact hole formed in said interlayer insulating film and reaching one of said source and drain diffused layers;
   a metallic layer filling up said contact hole; and
   a capacitor formed on said interlayer insulating film and including a first polysilicon layer containing impurities and formed on said metallic layer, a dielectric film formed on said first polysilicon layer and a second polysilicon layer containing impurities and formed on said dielectric film, said first polysilicon layer being connected electrically to the one of said source and drain diffused layers through said metallic layer.

7. A semiconductor memory device according to claim 6, wherein said contact hole has such a size that said metallic layer filling up the contact hole is separated from said gate by a distance which is not smaller than a thickness of said interlayer insulating film, and extends across said one diffused layer so as to overlap with said field oxide layer.

* * * * *